United States Patent
Elsayed et al.

(10) Patent No.: US 9,614,528 B2
(45) Date of Patent: Apr. 4, 2017

(54) REFERENCE BUFFER CIRCUITS INCLUDING A NON-LINEAR FEEDBACK FACTOR

(71) Applicant: Silicon Laboratories Inc., Austin, TX (US)

(72) Inventors: Mohamed Mostafa Elsayed, Austin, TX (US); Shouli Yan, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 113 days.

(21) Appl. No.: 14/562,707

(22) Filed: Dec. 6, 2014

(65) Prior Publication Data

US 2016/0164522 A1    Jun. 9, 2016

(51) Int. Cl.
*H03K 3/00*    (2006.01)
*H03K 19/0185*    (2006.01)

(52) U.S. Cl.
CPC .......................... *H03K 19/018507* (2013.01)

(58) Field of Classification Search
CPC .................. G05F 1/575; H03K 19/018507
See application file for complete search history.

(56) References Cited

U.S. PATENT DOCUMENTS

| | | | | |
|---|---|---|---|---|
| 8,299,844 B2* | 10/2012 | Garverick | ............. | G01L 1/2256 327/513 |
| 8,471,538 B2* | 6/2013 | Pancholi | ................. | G05F 1/575 323/274 |
| 8,878,510 B2* | 11/2014 | Bhattacharyya | ........ | G05F 1/575 323/314 |
| 2010/0066320 A1* | 3/2010 | Dasgupta | .................. | G05F 1/56 323/273 |
| 2011/0221526 A1* | 9/2011 | Quan | ........................ | H03F 1/26 330/149 |
| 2011/0227652 A1* | 9/2011 | Froehlich | ................ | H03F 3/187 330/260 |
| 2013/0221937 A1* | 8/2013 | Yan | ......................... | G05F 1/565 323/271 |
| 2013/0221940 A1* | 8/2013 | Yan | ......................... | G05F 1/565 323/273 |
| 2013/0307502 A1* | 11/2013 | Bhattacharyya | ........ | G05F 1/565 323/282 |
| 2016/0147239 A1* | 5/2016 | Yan | ......................... | G05F 1/575 323/280 |

\* cited by examiner

*Primary Examiner* — Ryan Jager
(74) *Attorney, Agent, or Firm* — Cesari & Reed LLP; R. Michael Reed

(57) ABSTRACT

In an embodiment, an apparatus may include an amplifier circuit including a first input to receive a signal, a second input to receive a feedback signal, and an output. The apparatus may further include a buffer circuit including an input coupled to the output of the amplifier and including an output coupled to an output node. The apparatus may also include a feedback circuit coupled between the output node and the second input of the amplifier circuit. The feedback circuit may include at least one non-linear resistor configured to define a feedback ratio that changes in response to a voltage at the output node.

19 Claims, 5 Drawing Sheets

REFERENCE BUFFER CIRCUITS INCLUDING A NON-LINEAR FEEDBACK FACTOR

FIELD

The present disclosure is generally related to reference buffer circuits, and more particularly to reference buffer circuits including a feedback factor.

BACKGROUND

Reference buffer circuits sometimes include an output stage to drive a load, such as a capacitive load.

SUMMARY

In some embodiments, an apparatus may include an amplifier circuit including a first input to receive a signal, a second input to receive a feedback signal, and an output. The apparatus may further include a buffer circuit including an input coupled to the output of the amplifier and including an output coupled to an output node. The apparatus may also include a feedback circuit coupled between the output node and the second input of the amplifier circuit. The feedback circuit may include at least one non-linear resistor configured to define a feedback ratio that changes in response to a voltage at the output node.

In other embodiments, an apparatus may include an amplifier circuit including a first input to receive a signal, a second input to receive a feedback signal, and an output. The apparatus may further include a buffer circuit including an input coupled to the output of the amplifier and including an output coupled to an output node. The apparatus may also include a feedback circuit coupled between the output node and the second input of the amplifier circuit, the feedback circuit including a resistive circuit having a feedback ratio that changes in response to a voltage at the output node.

In still other embodiments, a method of driving an output load may include amplifying an input signal using an amplifier circuit including a first input to receive the input signal, a second input to receive a feedback signal, and an output to provide an output signal at an output node. The method may further include applying the output signal to a feedback circuit to provide a partial feedback to the second input as the feedback signal. The feedback circuit may include a first resistor coupled between the output node and a feedback node and may include a second resistor coupled to the feedback node. Further, the method may include automatically adjusting a resistive ratio defined by the first resistor and the second resistor in response to a voltage at the output node.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Embodiments of circuits and methods are described below that may include a buffer with a feedback loop through one or more resistive elements configured to implement a partial feedback. In some embodiments, the one or more resistive elements may provide a non-linear resistance, which may provide a variable resistance in response to a voltage at the output.

Figure 1:
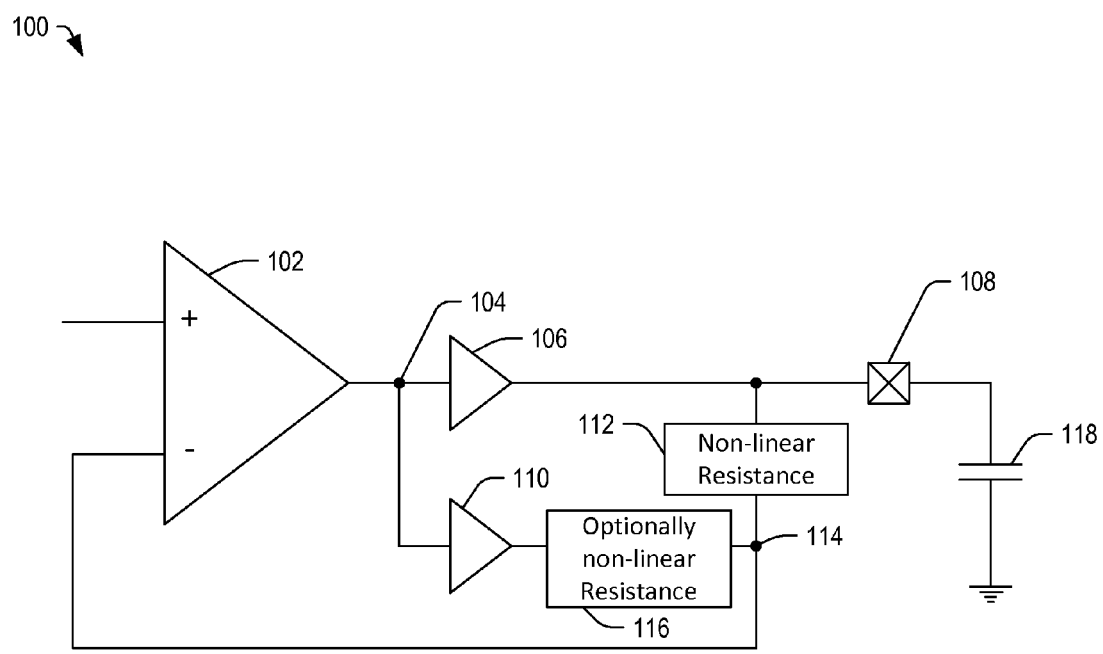
FIG. 1 is a diagram of a buffer circuit including a non-linear feedback factor, in accordance with certain embodiments.

FIG. 1 is a diagram of a buffer circuit 100 including a non-linear feedback factor, in accordance with certain embodiments. The buffer circuit 100 may include a differential amplifier 102 including a first input to receive a signal (such as a reference signal), a second input to receive a feedback signal, and an output coupled to a node 104. The buffer circuit 100 may further include a first driver 106 having an input coupled to the node 104 and having an output coupled to a node 108, such as input/output (I/O) of the buffer circuit 100. The node 108 may be coupled to a load, such as a capacitive load represented by capacitor 118, which may be coupled between the node 108 and a power supply, such as ground. The buffer circuit 100 may further include a second driver 110 having an input coupled to the node 104 and having an output. The buffer circuit 100 may also include a resistive element 112 coupled between the node 108 and a node 114, a resistive element 116 coupled between the output of the second driver 110 and the node 114. The node 114 may be coupled to the second input of the differential amplifier 102. The resistive elements 112 and 116 may be implemented by devices that provide a non-linear resistance, such as transistors or other elements.

In some embodiments, the buffer circuit 100 may be coupled to a liquid crystal display (LCD) and may drive a wide range of capacitive loads, such as loads ranging from 0 pF to 30 nF with a fast settling response and very low standby current. In a particular example, the buffer circuit 100 may be used as a reference buffer for an LCD. In some embodiments, the buffer circuit 100 may be configured to operate with other types of loads.

In operation, the capacitive load 118 may be driven by the first and second drivers 106 and 110, which may represent a class AB output stage. The first and second drivers 106 and 110 may prevent load variations from affecting the stability of the loop. The resistive element 112 may provide a partial feedback to the second input of the differential amplifier 102 via the node 114, which partial feedback enhances the settling time of the node 108 when the voltage on the output is disturbed. The feedback factor (FB) may be determined according to the following equation.

$$FB = \frac{R_{116}}{R_{116} + R_{112}} \quad (1)$$

In some embodiments, reducing the resistance of the resistive element 112 may improve setting time. However, reducing the resistance may also represent a tradeoff with respect to phase margin. In some embodiments, it may be desirable for the resistive element 112 to present a small resistance when the output voltage at the node 108 is far away from a steady state value and to present a larger resistance when the output voltage approaches the steady state to attain a selected phase margin.

In some embodiments, one or both of resistive element 112 and resistive element 116 may provide a non-linear resistance such that the feedback factor (FB) can change based on the voltage level at the node 108. In some embodiments, the non-linear resistance may respond more quickly than the loop response in order to avoid impacting the stability of the loop.

Figure 2:
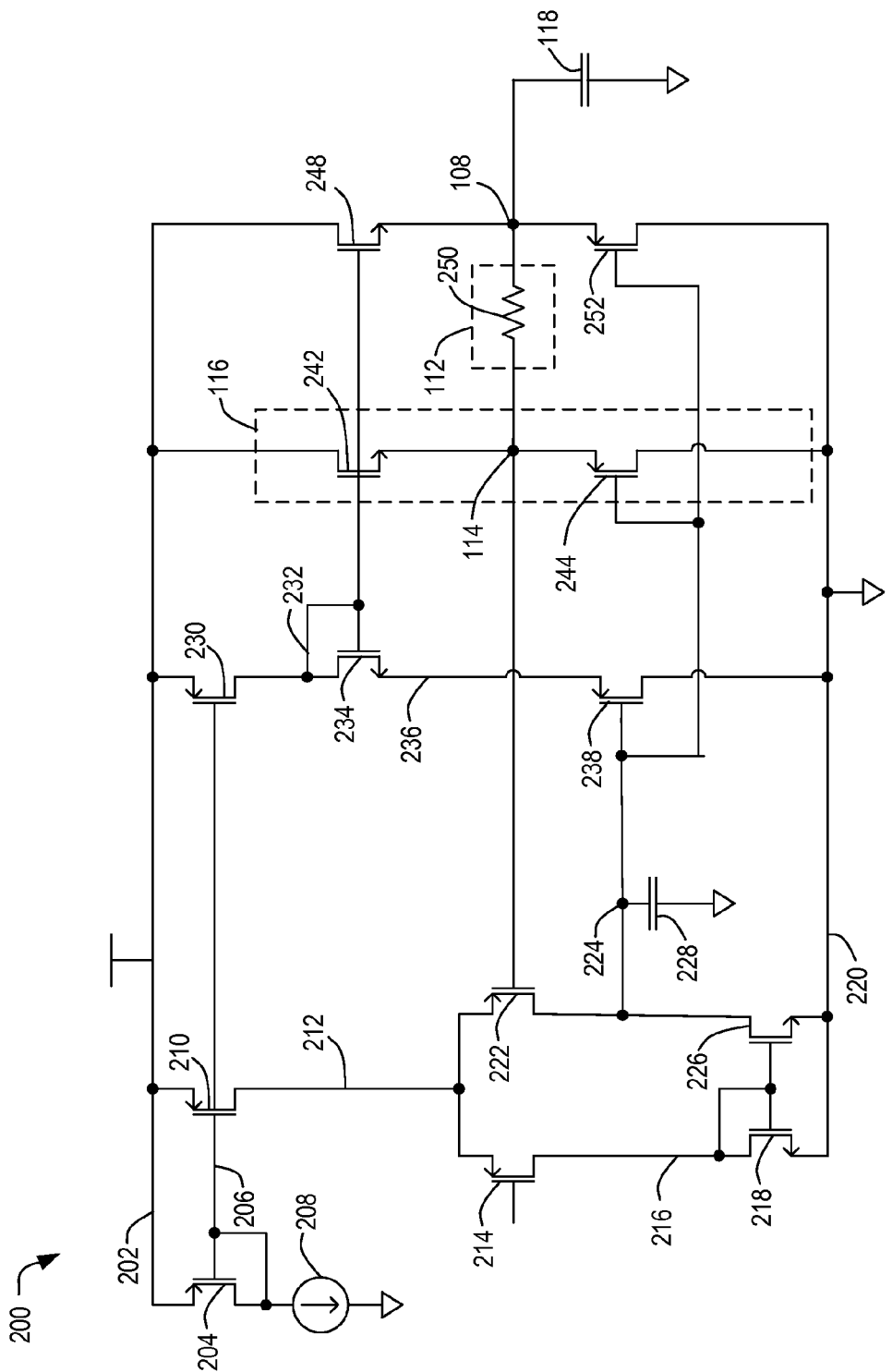
FIG. 2 is a block diagram of a buffer circuit including a non-linear feedback factor, in accordance with certain embodiments.

FIG. 2 is a block diagram of a buffer circuit 200 including a non-linear feedback factor, in accordance with certain embodiments. The buffer circuit 200 may include a node 202 coupled to a power supply. The buffer circuit 200 may further include a transistor 204 including a source coupled to the node, a gate coupled to a node 206, and a drain coupled to the node 206. The buffer circuit 200 may also include a current source 208 coupled between the node 206 and a supply node, such as ground.

The buffer circuit 200 may further include a transistor 210 having a source coupled to the node 202, a gate coupled to the node 206, and a drain coupled to a node 212. The buffer circuit 200 may further include a transistor 214 including a source coupled to the node 212, a gate to receive an input voltage signal ($V_{IN}$), and a drain coupled to a node 216. The buffer circuit 200 may also include a transistor 218 having a drain coupled to the node 216, a gate coupled to the node 216, and a source coupled to a node 220, which may be coupled to a power supply, such as ground. The buffer circuit 200 may also include a transistor 222 having a source coupled to the node 212, a gate coupled to the node 114, and a drain coupled to a node 224. The buffer circuit 200 can also include a transistor 226 having a drain coupled to the node 224, a gate coupled to the node 216, and a source coupled to the node 220.

The buffer circuit 200 may also include a capacitor 228 coupled between the node 224 and a power supply, such as ground. The buffer circuit 200 can further include a transistor 230 having a source coupled to the node 202, a gate coupled to the node 206, and a drain coupled to a node 232, which may be coupled to a drain and gate of a transistor 234. The transistor 234 may include a source coupled to a node 236, which may be coupled to a source of a transistor 238. The transistor 238 may include a gate coupled to the node 224 and a drain coupled to the node 220.

The buffer circuit 200 may include a non-linear resistive element 116 including a transistor 242 having a drain 142 coupled to the node 202, a gate coupled to the node 232, and a source coupled to the node 114. The non-linear resistive element 116 may further include a transistor 244 having a source coupled to the node 114, a gate coupled to the node 224, and a drain coupled to the node 220.

The buffer circuit 200 may include a transistor 248 having a drain coupled to the node 202, a gate coupled to the node 232, and a source coupled to the node 108. The buffer circuit 200 may include a resistive element 112 coupled between the node 108 and the node 114. In some embodiments, the resistive element 112 may be implemented as a resistor 250. In some embodiments, the resistive element 112 may be implemented as a non-linear resistance. The buffer circuit 200 may also include a transistor 252 having a source coupled to the node 108, a gate coupled to the node 224, and a drain coupled to the node 220. A capacitive load 118 may be coupled between the node 108 and a power supply, such as ground, or another buffer output.

In operation, the voltage at the node 108 is fed back through the resistive element 112 to the node 114, which voltage may be coupled to the gate of the transistor 222. The voltage at the node 114 is coupled to the gate of the transistor 222, affecting the amount of current flowing through the transistor 222 to the node 224, which in turn presents a voltage to the gates of the transistors 238, 244, and 252. When the output voltage at the node 108 is low, the voltage at the node 114 is also low, turning on the transistor 222 to allow current flow to the node 224. The voltage at the node 224 coupled to the gates of the transistors 238, 244, and 252 increases, turning off current flow such that the voltage at the node 108 may increase. When the output voltage at the node 108 is high, current flow through the transistor 222 may be reduced, which decreases the voltages at the gates of the transistors 238, 244, and 252, turning on current flow such that the voltage at the node 108 may be decreased.

The transistors 242 and 244 may present a non-linear resistance to the node 114. In the illustrated example, the transistors 204, 210, and 230 provide a current mirror such that the current at node 212 is proportional to the current at the node 232. The transistors 234 and 242 have a common gate configuration, such that current flow through the transistor 242 is proportional to current flow through transistor 234. The transistor 242 operates as a push transistor to push current into the node 114. The transistor 244 has a gate coupled to the node 224 such that as the current flow through transistor 222 increases, the charge on the capacitor 228 increases, and the voltage at the gate of the transistor 244 increases, decreasing current flow through the transistor 244. Thus, the current driven into the node 114 by the transistor 242 causes the voltage at the node 114 to increase. In contrast, if the current flow through the transistor 222 decreases, the charge on the capacitor 228 may decrease (by discharging through the diode connected transistor 226). As the capacitor 228 discharges, the voltage at the gate of the transistor 244 decreases, increasing current flow through the transistor 244 and pulling down the voltage at the node 114.

In some embodiments, the current flowing through the transistor 242 and the transistor 244 may be determined by the gate-to-source voltages (Vgs) of each transistor. The gate to source voltage of the transistor 242 may be controlled by the voltages at the node 232 and the node 114. The gate to source voltage of the transistor 244 may be controlled by the voltages at the node 114 and the node 224. The transistors 242 and 244 may construct a push-pull stage with an output resistance given by the parallel combination of the reciprocal of their transconductances. This output resistance can be non-linear when the voltage at the output node 114 suffers large-signal swings.

In the illustrated example, the resistor 250 may operate to buffer the gate of the transistor 222 from the node 108, enhancing the stability of the driver circuit provided by the transistors 214, 218, 222, and 226. However, the resistive element 112 may be formed from a circuit element configured to provide a non-linear resistance. One possible implementation of a circuit having such a non-linear resistance is described below with respect to FIG. 3.

Figure 3:
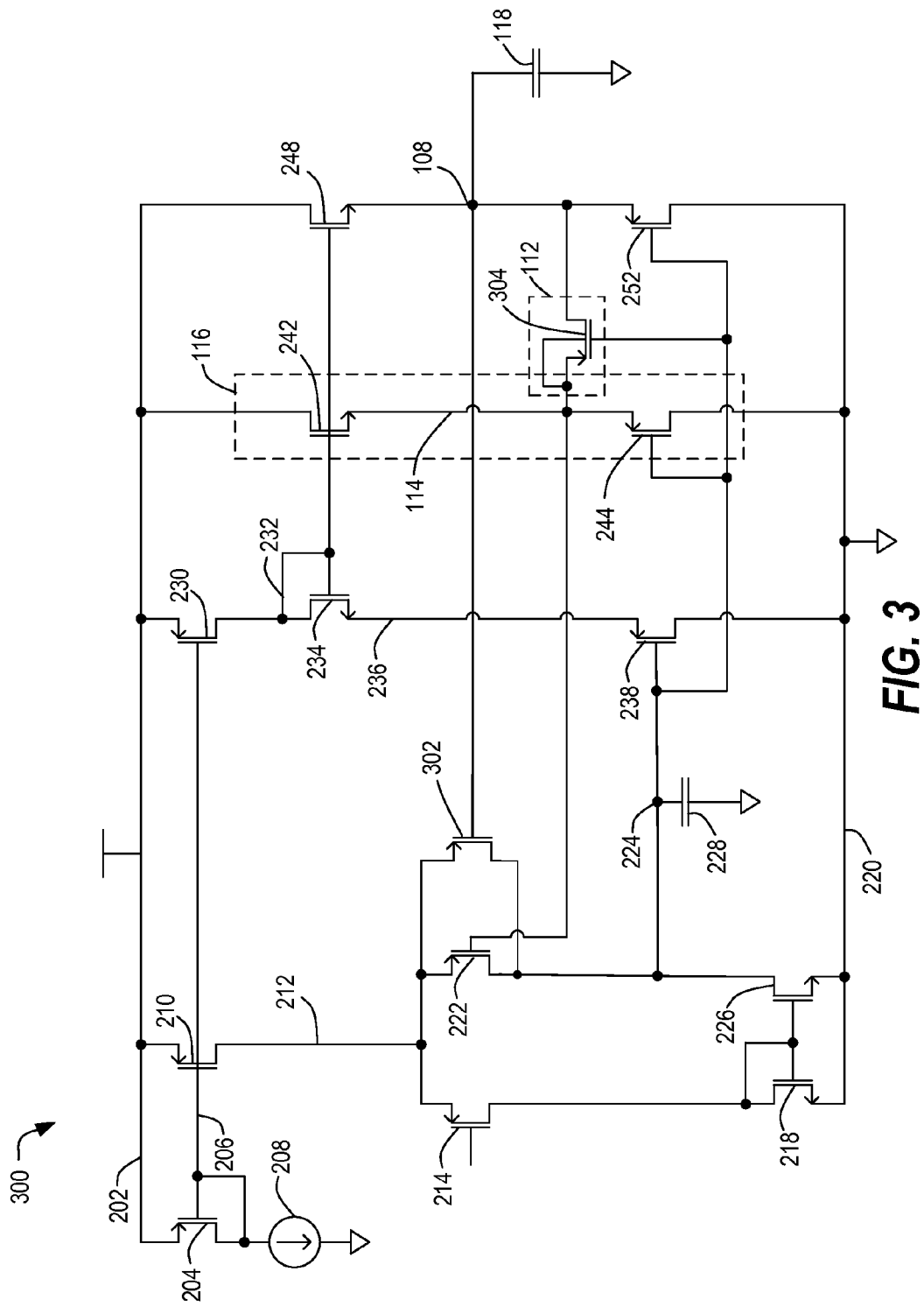
FIG. 3 is a diagram of a buffer circuit including a non-linear feedback factor, in accordance with certain embodiments.

FIG. 3 is a diagram of a buffer circuit 300 including a non-linear feedback factor, in accordance with certain embodiments. The circuit 300 includes all of the elements of the circuit 200 of FIG. 2, except that the resistor 250 may be replaced with a non-linear resistive element, and an additional transistor may be provided with respect to the driver circuit.

The circuit 300 includes a transistor 302 including a source coupled to the node 212, a gate coupled to the node 108, and a drain coupled to the node 224. The gate of the transistor 222 may be coupled to the node 108 through a non-linear resistive element 112, such as a transistor 304. The transistor 304 includes a source coupled to the gate of the transistor 222, which is also coupled to the node 114, a gate coupled to the node 224, and a drain coupled to the node 108.

In some embodiments, the transistors 302 and 304 provide non-linearity. When the output voltage (Vo) at the node 108 goes high, the impedance of the transistor 304 decreases, and the partial feedback to the gate of the transistor 222 becomes almost full feedback until the output voltage (Vo) at the node 108 approaches its steady state value. Since the source of the transistor 304 is coupled to the node 114, the voltage at the node 114 may follow the voltage at the node 108 when the output voltage (Vo) goes high. Consequently, the output voltage at the node 108 is applied at the gate of the transistor 222, which converts the partial feedback to full feedback during a transient event. In some embodiments, when the output voltage (Vo) at the node 108 goes low, the transistor 302 dominates over the transistor 222 and the partial feedback becomes almost full feedback at the gate of the transistor 302 until the output voltage (Vo) becomes close to its steady-state value.

In some embodiments, the non-linear effect provided by the transistors 302 and 304 may work provided the output is more than 50 mV away from its steady state value. Since the non-linearity is implemented using the transistor 304, it is guaranteed to be faster than the loop and does not affect the stability of the buffer.

In certain embodiments, the output node 108 and the corresponding load 118 may be coupled to the buffer-loop-output through a non-linear resistive element 304, which implements partial feedback. In a particular example, the linear resistance is replaced with the transistors 302 and 304, splitting the input transistor of the differential pair into two transistors, one of which is driven by the output. The non-linear resistive element 304 allows for a faster response than traditional linear resistors without increasing the power consumption.

Figure 4:
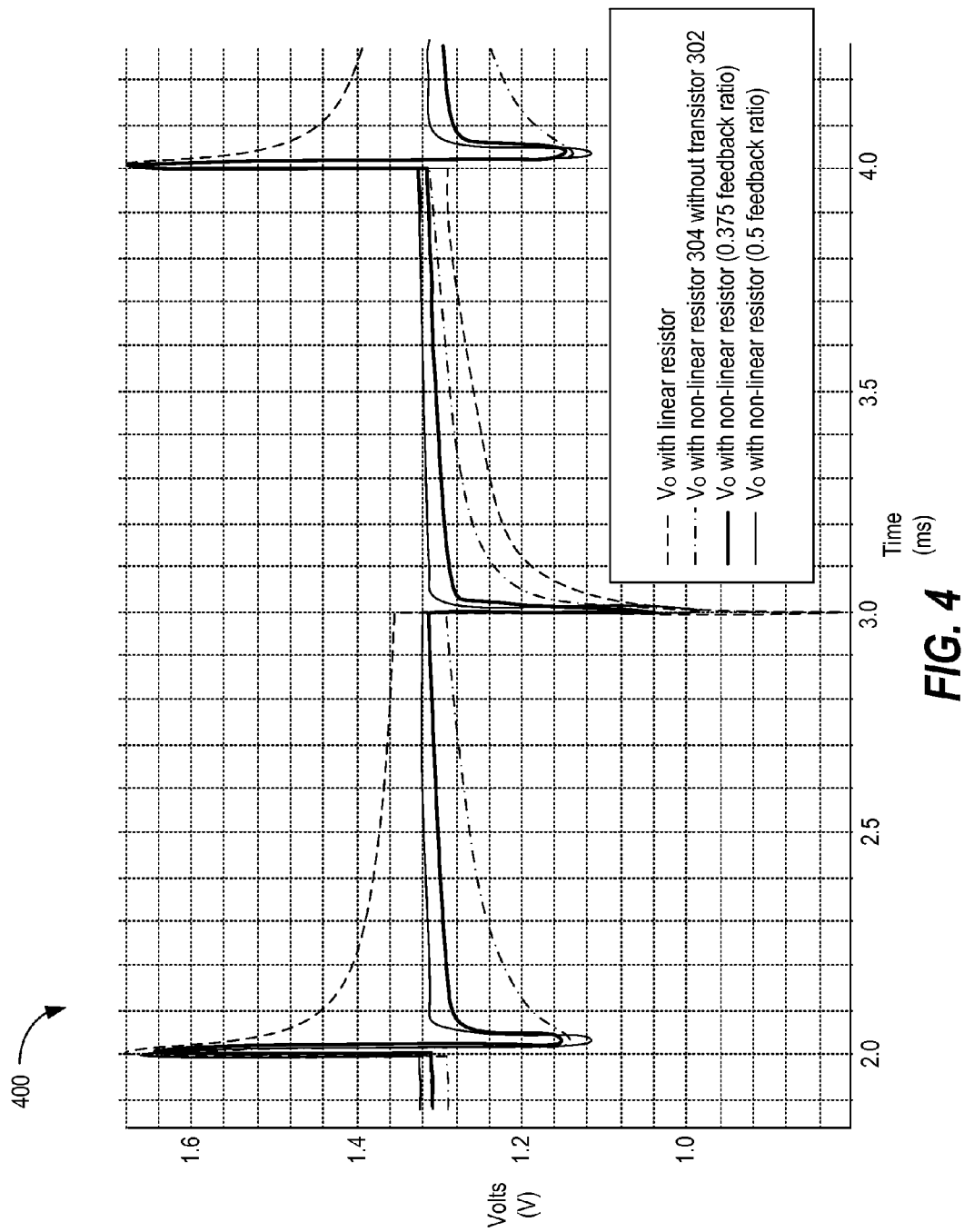
FIG. 4 is a graph of the transient response in volts versus time in milliseconds for various configurations of a buffer circuit with a non-linear feedback factor, in accordance with certain embodiments.

FIG. 4 is a graph 400 of the transient response in volts versus time in milliseconds for various configurations of a buffer circuit with a non-linear feedback factor, in accordance with certain embodiments. The graph 400 shows the transient response of the different designs with a 30 of load capacitor (e.g., the capacitor 118 in FIGS. 1-3) and with the capacitor switching with a 1 volt swing. Each of the implementations utilize the same power consumption.

In a conventional buffer with a linear resistive feedback, the output voltage at the node 108 swings from approximately 1.68 volts to approximately 0.8 volts with a relatively slow exponential decay from approximately 1.68 volts at a first time (2 ms) to approximately 1.36 volts at a second time (3 ms). When the linear resistor is replaced with a non-linear resistance, the output voltage at the node 108 demonstrates a similar voltage swing, though the exponential decay is from approximately 1.1 volts at the first time (2 ms) to approximately 1.3 volts at the second time (3 ms).

It is possible to scale the ratios of the non-linear resistances by adjusting the geometries of the transistors 302 and 304. By adjusting the ratio of the nonlinear resistances to provide a feedback factor of 0.375, the exponential decay is from approximately 1.16 volts at the first time (2 ms) to approximately 1.32 volts at the second time (3 ms). By increasing the ratio of the ratio to 0.5, the exponential decay becomes much steeper, decreasing from about 1.12 volts at the first time (2 ms) to approximately 1.31 volts at a time of 2.1 ms, which voltage decays to approximately 1.32 volts at a time of 3 ms, providing a faster response.

Figure 5:
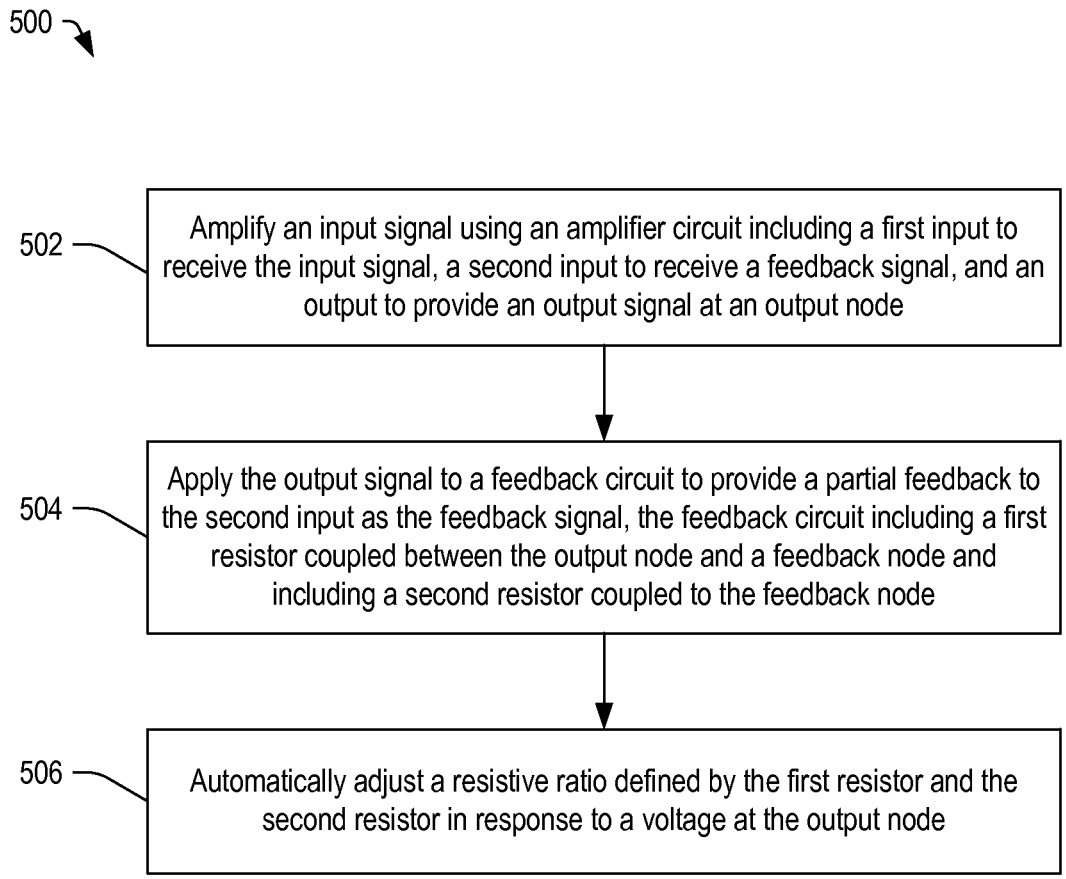
FIG. 5 is a flow diagram of a method of providing non-linear feedback, in accordance with certain embodiments.

FIG. 5 is a flow diagram of a method 500 of providing non-linear feedback, in accordance with certain embodiments. The method 500 may include amplifying an input signal using an amplifier circuit including a first input to receive the input signal, a second input to receive a feedback signal, and an output to provide an output signal at an output node, at 502. In some embodiments, the amplifier may include a pair of source coupled transistors including a first transistor having a gate to receive the input signal and a second transistor having a gate to receiving the feedback signal.

The method 500 may further include applying the output signal to a feedback circuit to provide a partial feedback to the second input as the feedback signal, where the feedback circuit may include a first resistor coupled between the output node and a feedback node and may include a second resistor coupled to the feedback node. In some embodiments, the first resistor and the second resistor may be implemented as transistors. In some embodiments, at least one of the first resistor and the second resistor provides a non-linear resistance.

The method 500 may also include automatically adjusting a resistive ratio of the non-linear resistor and the second resistor in response to a voltage at the output node. The transistors may be designed or selected to have an initial geometric ratio at a steady state voltage level that defines the initial feedback factor (initial resistive ratio). The resistive ratio, however, is configured to change in response to the voltage at the output node when the voltage varies from the steady state voltage.

In some embodiments, the method may further include coupling the output node to a gate of a transistor and applying the output signal across a non-linear resistor coupled between the output node and a gate of a second transistor. As discussed above with respect to FIGS. 2 and 3, the output voltage may be applied to a non-linear resistor to provide a partial feedback to the amplifier, which partial feedback may provide a faster response than that provided by a linear resistance. The linear resistance, particularly in combination with a capacitive load, may provide a slower exponential signal than that provided with the non-linear resistance.

In some embodiments, automatically adjusting the resistive ratio may include activating a first transistor when the output signal falls below a steady state value by more than a first threshold and activating a second transistor when the output signal is above the steady state value by more than a second threshold. The transistors present non-linear resistances that, when activated, alter their input resistance, thereby altering the resistive ratio (whether used in conjunction with a linear resistor or another non-linear resistor).

Embodiments of circuits, methods and apparatuses are described above with respect to FIGS. 1-5 that may include at least one non-linear resistive element arranged in a feedback loop to provide partial feedback to an amplifier circuit. In some embodiments, the non-linear resistive element may enhance the feedback response of the circuit by reducing the time constant of the exponential decay in response to the voltage at the output.

Although the present invention has been described with reference to preferred embodiments, workers skilled in the art will recognize that changes may be made in form and detail without departing from the scope of the invention.

What is claimed is:

1. An apparatus comprising:
an amplifier circuit including a first input to receive a signal, a second input to receive a feedback signal, and an output;
a first buffer circuit including an input coupled to the output of the amplifier and including an output coupled to an output node;
a second buffer circuit including an input coupled to the output of the amplifier circuit and including an output; and
a feedback circuit coupled between the output nodes of the first and second buffer circuits and the second input of the amplifier circuit, the feedback circuit including at least one non-linear resistor configured to define a feedback ratio that changes in response to a voltage at the output node, wherein the at least one non-linear resistor comprises:
a first non-linear resistor coupled between the output node of the first buffer circuit and a feedback node that is coupled to the second input of the amplifier; and
a second non-linear resistor coupled between the output of the second buffer circuit and the feedback node.

2. The apparatus of claim 1,
wherein the first non-linear resistor and the second non-linear resistor define the feedback ratio.

3. The apparatus of claim 1, wherein the feedback circuit comprises:
a first resistor coupled between the output node and a feedback node, the feedback node coupled to the second input of the amplifier; and
a second resistor coupled between the output of the second buffer circuit and the feedback node;
wherein at least one of the first resistor and the second resistor is a non-linear resistor.

4. The apparatus of claim 1, wherein the amplifier circuit comprises:
a first transistor including a source to receive a voltage, a gate forming the first input, and a drain;
a second transistor including a source coupled to the source of the first transistor, a gate coupled to a feedback node, and a drain.

5. The apparatus of claim 4, wherein the feedback circuit comprises:
a resistor coupled between the output node and the feedback node; and
a non-linear resistance including:
a third transistor including a drain coupled to a power supply node, a gate configured to receive bias signal, and a drain coupled to the feedback node;
a fourth transistor including a source coupled to the feedback node, a gate coupled to the drain of the second transistor, and a drain; and
a diode circuit having an anode coupled to the drain of the fourth transistor and a cathode coupled to a second power supply node.

6. The apparatus of claim 4, further comprising:
a third transistor including a source coupled to the sources of the first and second transistors, a gate coupled to the output node, and a drain coupled to the drain of the second transistor; and
a fourth transistor including a drain coupled to the output node, a gate coupled to the drain of the second transistor, and a source coupled to the gate of the second transistor.

7. The apparatus of claim 6, wherein the feedback ratio is defined by relative geometries of the third transistor and the fourth transistor.

8. The apparatus of claim 1, wherein the feedback ratio becomes smaller when the voltage at the output node is far from a steady state value and returns to an initial feedback ratio when the voltage at the output node reaches the steady state value.

9. An apparatus comprising:
an amplifier circuit including a first input to receive a signal, a second input to receive a feedback signal, and an output;
a buffer circuit including an input coupled to the output of the amplifier and including an output coupled to an output node; and
a feedback circuit coupled between the output node and the second input of the amplifier circuit, the feedback circuit including a resistive circuit having a feedback ratio that changes in response to a voltage at the output node; the feedback circuit including:
a resistor coupled between the output node and a feedback node; and
a non-linear resistance coupled between a power supply node and a power supply and coupled to the feedback node.

10. The apparatus of claim 9, wherein the amplifier circuit comprises:
a first transistor including a source to receive a voltage, a gate forming the first input, and a drain;
a second transistor including a source coupled to the source of the first transistor, a gate coupled to the feedback node, and a drain.

11. The apparatus of claim 10, wherein
the non-linear resistance comprises:
a third transistor including a drain coupled to the power supply node, a gate configured to receive bias signal, and a source coupled to the feedback node; and
a fourth transistor including a source coupled to the feedback node, a gate coupled to the drain of the second transistor, and a drain coupled to the power supply.

12. The apparatus of claim 11, further comprising:
a fifth transistor including a source coupled to the sources of the first and second transistors, a gate coupled to the output node, and a drain coupled to the drain of the second transistor; and
a sixth transistor including a drain coupled to the output node, a gate coupled to the drain of the second transistor, and a source coupled to the feedback node; and
wherein the feedback ratio is defined by relative geometries of the second transistor, the third transistor, the fourth transistor, the fifth transistor, and the sixth transistor.

13. The apparatus of claim 9, wherein the resistive circuit comprises:
a first resistor coupled between the output node and a feedback node, the feedback node coupled to the second input of the amplifier; and
a second resistor coupled to the feedback node;
wherein at least one of the first resistor and the second resistor is a non-linear resistor.

14. The apparatus of claim 9, wherein the feedback ratio becomes larger when the voltage at the output node is far from a steady state value and returns to an initial feedback ratio when the voltage at the output node reaches the steady state value.

15. The apparatus of claim 9, further comprising a second buffer circuit including an input coupled to the output of the amplifier circuit and including an output coupled to the feedback circuit.

16. The apparatus of claim 15, wherein the feedback circuit comprises:
a first non-linear resistor coupled between the output node and a feedback node, the feedback node coupled to the second input of the amplifier; and
a second non-linear resistor coupled between the output of the second buffer circuit and the feedback node;
wherein the first non-linear resistor and the second non-linear resistor define the feedback ratio.

17. A method of driving an output load, the method comprising:
amplifying an input signal using an amplifier circuit including a first input to receive the input signal, a second input to receive a feedback signal, and an output to provide an output signal at an output node;
applying the output signal to a feedback circuit to provide a partial feedback to the second input as the feedback signal, the feedback circuit including a first resistor coupled between the output node and a feedback node and including a second resistor coupled to the feedback node; and
automatically adjusting a resistive ratio defined by the first resistor and the second resistor in response to a voltage at the output node.

18. The method of claim 17, applying the output signal to the feedback circuit comprises:
coupling the output node to a gate of a transistor; and
applying the output signal across a non-linear resistor coupled between the output node and a gate of a second transistor.

19. The method of claim 17, wherein automatically adjusting the resistive ratio comprises:
activating a first transistor when the output signal falls below a steady state value by more than a first threshold; and
activating a second transistor when the output signal is above the steady state value by more than a second threshold.

* * * * *